United States Patent [19]
Arai

[11] Patent Number: 5,994,703
[45] Date of Patent: Nov. 30, 1999

[54] PRINTED SHEET FOR DEFLECTION COILS

[75] Inventor: Yoshihiro Arai, Tokyo, Japan

[73] Assignee: JEOL Ltd., Tokyo, Japan

[21] Appl. No.: 08/811,774

[22] Filed: Mar. 6, 1997

[30] Foreign Application Priority Data

Mar. 6, 1996 [JP] Japan ........................................ 8-04809

[51] Int. Cl.⁶ .................................................. H01J 37/14
[52] U.S. Cl. ................................ 250/396 ML; 313/361.1
[58] Field of Search ........................ 250/396 ML, 396 R; 313/361.1

[56] References Cited

U.S. PATENT DOCUMENTS

| | | | |
|---|---|---|---|
| 3,702,450 | 11/1972 | Avery et al. | 355/213 |
| 3,781,732 | 12/1973 | Wollnik | 250/396 R |
| 4,519,691 | 5/1985 | Yamada et al. | 354/400 |
| 5,068,612 | 11/1991 | Auslander et al. | 324/327 |
| 5,264,706 | 11/1993 | Oae et al. | 250/396 ML |
| 5,349,744 | 9/1994 | Takahashi | 29/602.1 |
| 5,623,208 | 4/1997 | Hasegawa | 324/318 |
| 5,773,976 | 6/1998 | Sakakura et al. | 324/318 |

FOREIGN PATENT DOCUMENTS

| | | |
|---|---|---|
| 60563 | 5/1977 | Japan . |
| 160947 | 9/1984 | Japan . |

*Primary Examiner*—Bruce C. Anderson
*Attorney, Agent, or Firm*—Webb Ziesenheim Logsdon Orkin & Hanson, P.C.

[57] ABSTRACT

A printed circuit for forming deflection coils used, for example, in a scanning electron microscope. The printed circuit permits some of scroll coil circuits to be connected with an external circuit with or without connecting them in series. There is also disclosed a printed circuit capable of forming deflection coils which are small in size but produce strong magnetic fields. A printed circuit according to the invention comprises a sheet on which the scroll coils and indicia are printed. When the sheet is wound into a cylinder, the scroll coils are arranged circumferentially.

8 Claims, 7 Drawing Sheets

PRINTED SHEET FOR DEFLECTION COILS

FIELD OF THE INVENTION

The present invention relates to deflection coils used to deflect an electron beam, for example, in a scanning electron microscope and, more particularly, to a printed circuit having printed scroll coils for creating deflection coils.

BACKGROUND OF THE INVENTION

It has been known that coils for controllably deflecting a charged-particle beam in an electron microscope or the like are fabricated by printing plural scroll coil circuits on a flexible insulating sheet. Techniques of this kind are disclosed, for example, in Japanese Patent Unexamined Publication Nos. 160947/1984 and 60563/1977.

Techniques for fabricating deflection coils by printing scroll coils with a conductive material on both sides of an insulating sheet and winding the sheet into a cylinder are disclosed in these Patent Publications.

The above-described prior-art techniques fail to take account of a case in which the number of printed scroll coils stacked on top of each other is increased to produce a strong deflecting magnetic field. Accordingly, with these prior-art techniques, it is difficult to construct small-sized coils capable of accurately developing a strong deflecting magnetic field in a desired direction, for the following reasons.

In order to fabricate coils for producing a strong magnetic field in a desired direction with high accuracy, using the aforementioned printed circuit, the following requirements (a) and (b) must be satisfied.

(a) In order to setup a strong magnetic field, it is necessary to stack a number of scroll coils printed on the printed circuit on top of each other. One conceivable method of arranging these printed scroll coils so as to stack them on top of each other is to wind the printed circuit into a cylinder in plural layers. Another conceivable method is to fold the printed scroll coils. Where the former lap-winding method is adopted, it is necessary to place the stacked scroll coils in position circumferentially accurately.

(b) In order to develop a strong magnetic field, it is necessary that the scroll coils be excited with greater currents.

However, where the above-described lap-winding method is utilized, if the printed circuit is wound in more layers in order that more scroll coils be stacked, then outer scroll coils are shifted circumferentially with respect to inner scroll coils. This causes a deviation of the direction of the produced magnetic field from the intended direction.

Where the number of printed scroll coils is increased, if these numerous scroll coils are connected in series, the resistance is increased, thus resulting in decreases in currents flowing through the scroll coils. Therefore, connecting too many scroll coils in series is undesirable. Accordingly, if a multiplicity of scroll coils are connected in parallel, each scroll coil needs a feeding external connector terminal and a connector lead that connects this coil to the external connector terminal. If the number of external connector terminals is increased, it is cumbersome to make a connection with an external circuit.

SUMMARY OF THE INVENTION

It is an object of the present invention to provide a printed circuit which forms deflection coils and which can be connected with an external circuit with or without connecting some of scroll coils printed on the printed circuit in series with each other before the connection with the external circuit is made.

It is another object of the invention to provide a printed circuit which can form small-sized deflection coils capable of developing a strong magnetic field.

It is a further object of the invention to provide a printed circuit forming scroll coils which are so arranged that inner scroll coils are prevented from being shifted circumferentially with respect to outer scroll coils if the printed circuit is wound in multiple layers so as to lap-wind the scroll coils many times.

The present invention devised to solve the foregoing problems is next described. To facilitate understanding the correspondence of the elements of the present invention to the elements of the illustrative embodiments described later, the reference numerals used to indicate the elements of the illustrative embodiments are attached to the elements of the invention with parentheses. It is to be understood that this is not intended to restrict the scope of the invention to the illustrative embodiments.

A printed circuit according to the invention is adapted to form deflection coils and comprises: a sheet (S) having circuit printed regions (Sa) and conductive interconnect printed regions (Sb); a plurality of scroll coil circuits (A1–H8) printed in said circuit printed regions (Sa); external connector terminals (T) printed in said conductive interconnect printed regions (Sb) and acting to connect said scroll coil circuit (A1–H8) with an external circuit; conductive interconnects printed in said conductive interconnect printed regions (Sb) and acting to connect said scroll coil circuits (A1–H8) with said external connector terminals (T); said external connector terminals (T) having independent connection terminals (A0, A9–H0, H9) for connecting said scroll coil circuits (A1–H8) with said external circuit independently, said external connector terminals further including series connection terminals (A0'–H9') for connecting some of said scroll coil circuits (A1–H8) in series with each other and with said external circuit; independent connection terminal interconnects (A9–B0, C9–D0, E9–F0, G9–H0) for connecting the independent connection terminals (A0, A9–H0, H9) of some of said scroll coil circuits (A1–H8) with each other to connect these scroll coil circuits in series; and independent/series connection terminal interconnects (A0–A0' through H9–H9') for connecting said independent connection terminals (A0, A9–H0, H9) with said series connection terminals (A0'–H9'), both ends of each of said scroll coil circuits connected in series being connected with said independent connection terminals (A0, A9–H0, H9).

Another printed circuit according to the invention is adapted to form deflection coils and comprises: a sheet (S) lap-wound into a cylinder; a plurality of scroll coils (A1–H8) printed on said sheet (S) in such a way that, when said sheet is wound into the cylinder, said scroll coils (A1–H8) are arranged circumferentially and each one of said scroll coils covers a half revolution, each of said scroll coils having a circumferential width which increases with going outward; and indicia (3) marked on said sheet (S) and arranged circumferentially of said cylinder to indicate positions at which said scroll coils (A1–H8) are printed.

A further printed circuit according to the invention is adapted to form deflection coils and comprises: a sheet (S) having a square hole formation region (6) and scroll formation regions (Sa) connected with four sides, respectively, of said hole formation regions (6) so as to be foldable; a hole (6a) formed in a central region of said hole formation region (6); rectangular portions of the same shape formed in said scroll formation regions, said scroll formation regions being capable of being folded in such a way that said rectangular portions of the same shape overlap each other; and scroll coils (A1–H8) printed in said rectangular portions.

Other objects and features of the invention will appear in the course of the description thereof, which follows.

DESCRIPTION OF THE PREFERRED EMBODIMENTS

Figure 1A:
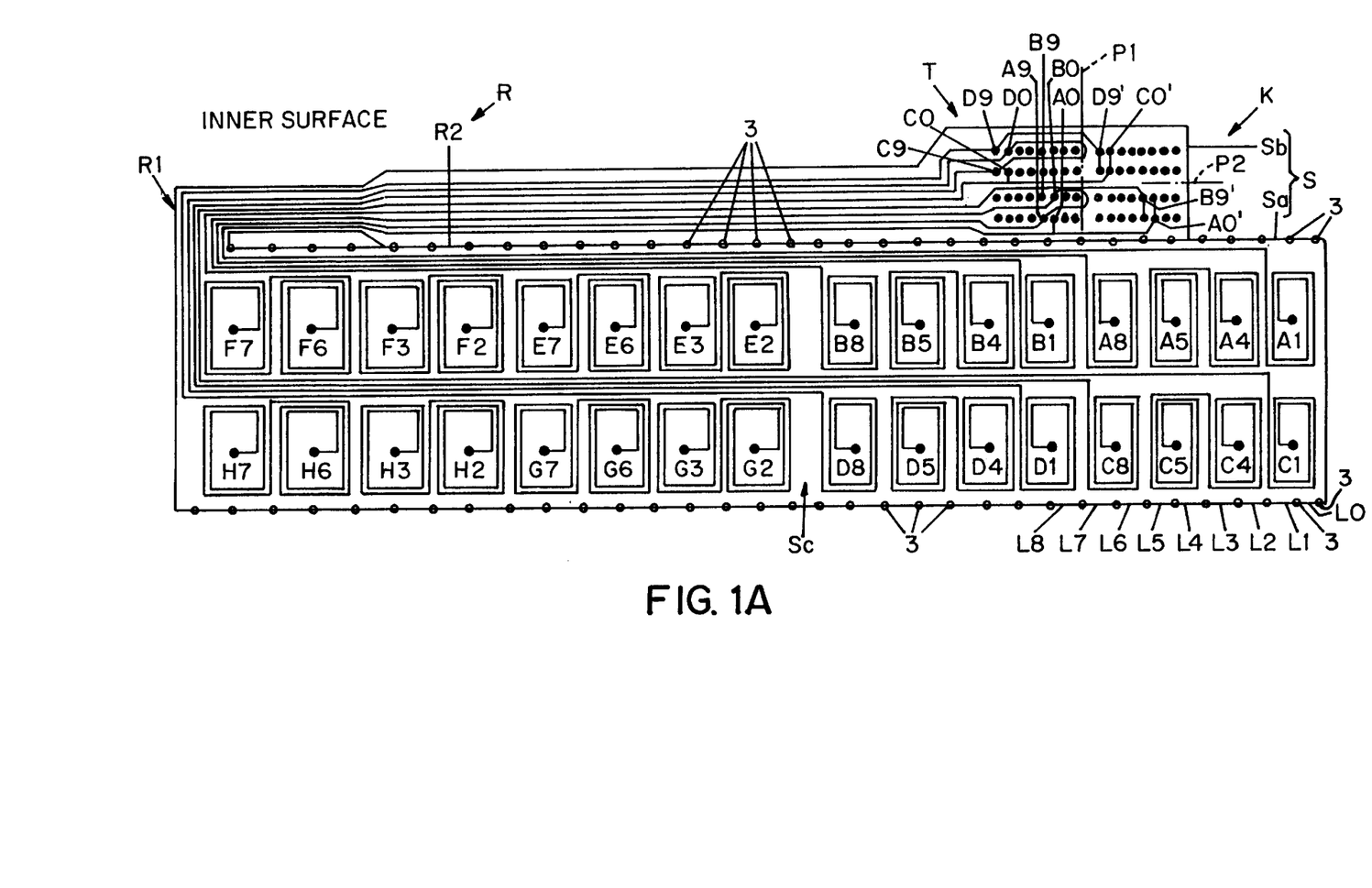
FIG. 1A is a side elevation of a printed circuit according to the invention, showing the inner surface of a cylinder formed by winding the printed circuit for forming deflection coils.
Figure 1B:
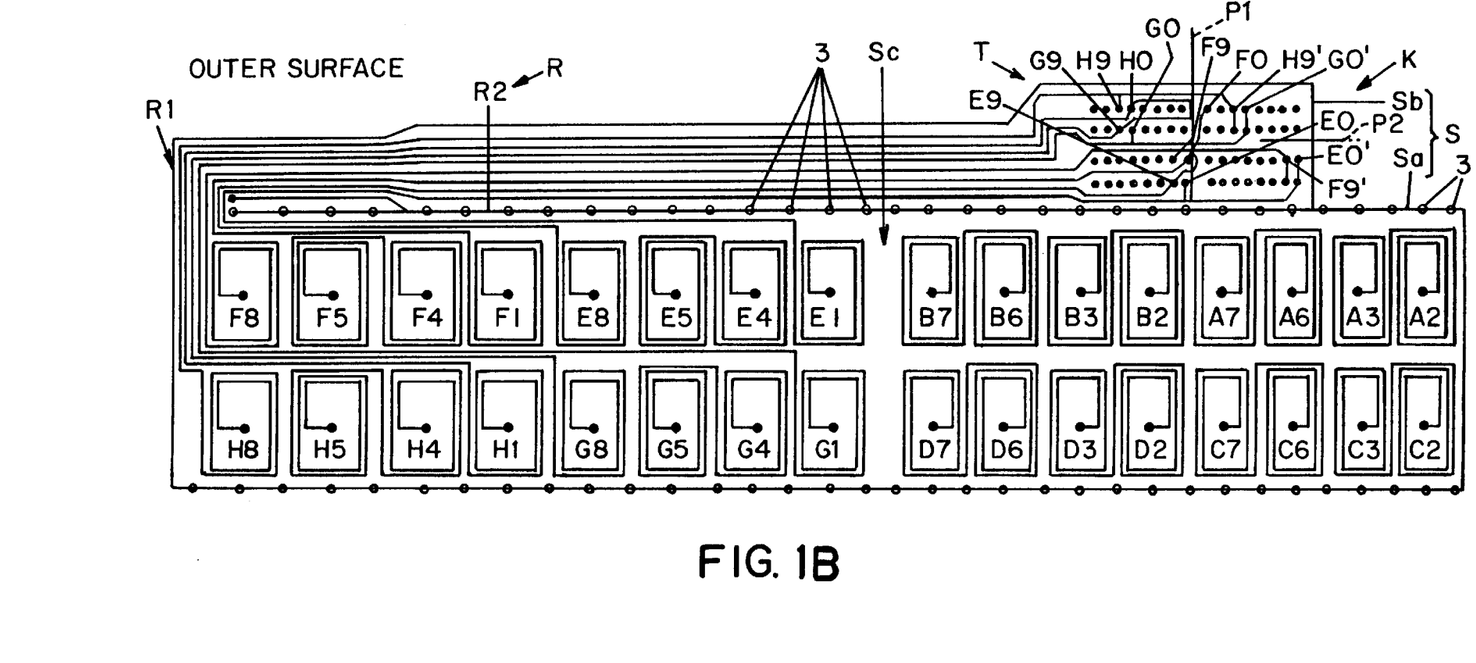
FIG. 1B is a side elevation taken from the same direction as FIG. 1A, but showing the outer surface.
Figure 2A:
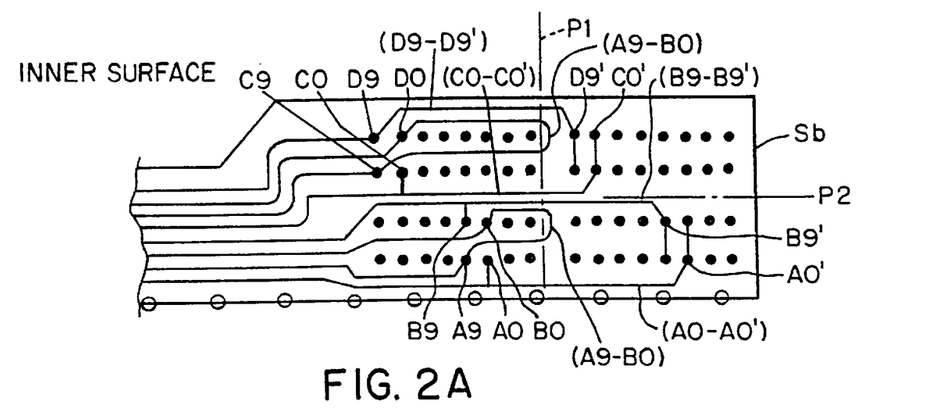
FIG. 2A is an enlarged view of main portions of FIGS. 1A and 1B on which external connector terminals T are printed.
Figure 2B:
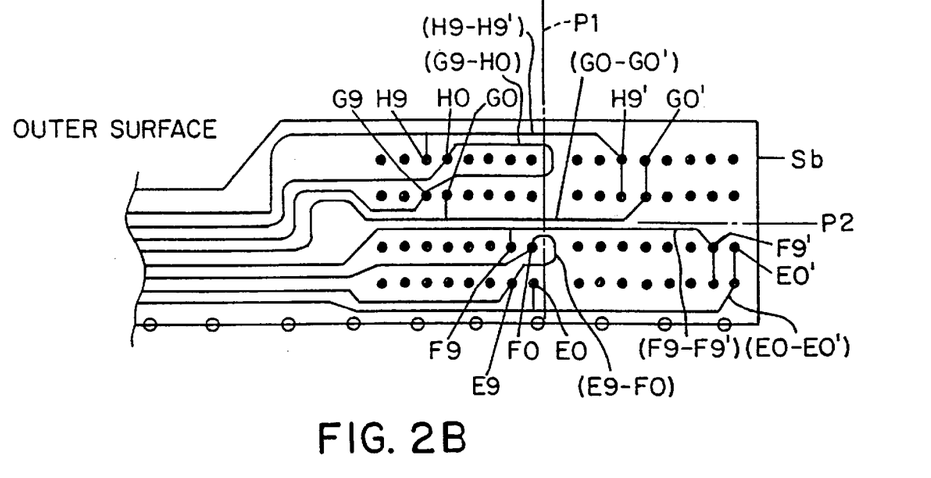
FIG. 2B is an enlarged view of main portions shown in FIG. 1B.
Figure 2C:
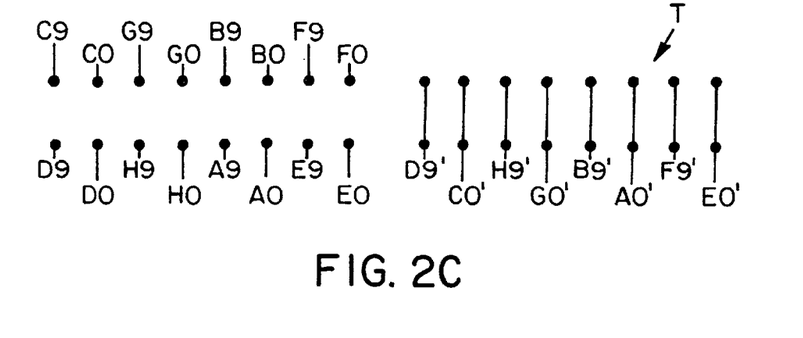
FIG. 2C is a diagram illustrating the manner in which the circuit shown in FIGS. 2A and 2B is bent along a bending line P2.
Figure 3:
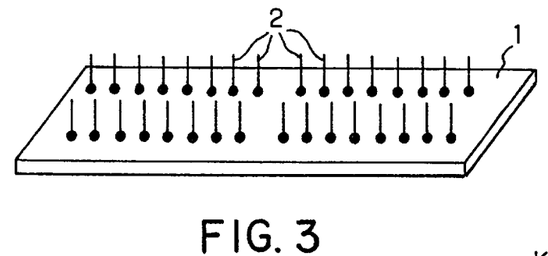
FIG. 3 is a perspective view of a connector to be connected with external connector terminals printed on a printed circuit.
Figure 4:
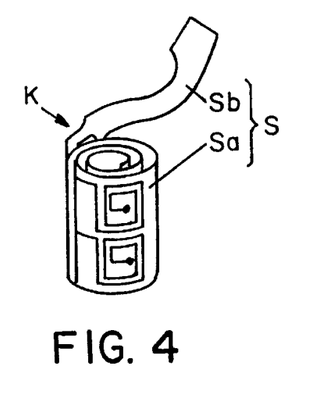
FIG. 4 is a perspective view of the printed circuit shown in FIGS. 1A and 1B, and in which the circuit has been wound into a cylinder.
Figure 5:
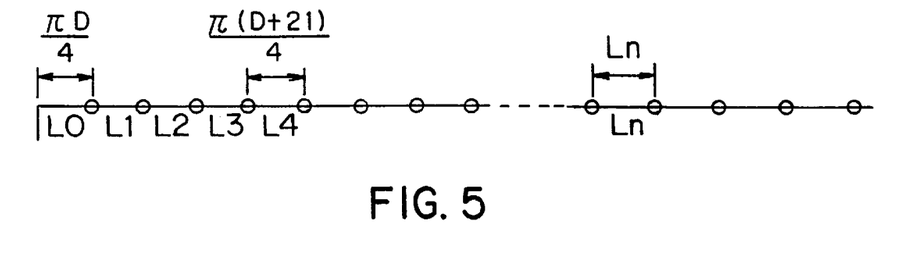
FIG. 5 is a diagram illustrating the spacing between indicia marked on the printed circuit shown in FIGS. 1A and 1B.

A printed circuit for forming deflections coils in accordance with the present invention is shown in FIGS. 1A and 1B. FIG. 1A shows the inner surface of a cylinder formed by winding the printed circuit. FIG. 1B is a side elevation taken from the same direction as FIG. 1A, but showing the outer surface. FIGS. 2A–2C show portions on which external connector terminals T shown in FIGS. 1A and 1B are printed. FIG. 2A is an enlarged view of main portions shown in FIG. 1A. FIG. 2B is an enlarged view of main portions shown in FIG. 1B. FIG. 2C shows the manner in which the printed circuit has been folded along a bending line P2. FIG. 3 is a perspective view of connectors to be connected with the external connector terminals printed on the printed circuit. FIG. 4 is a perspective view of the printed circuit shown in FIGS. 1A and 1B, and in which the printed circuit has been wound into a cylinder. FIG. 5 illustrates the spacing between indicia marked on the printed circuit shown in FIGS. 1A and 1B.

Referring to FIG. 1A, a printed circuit K for forming deflection coils comprises a flexible insulating sheet S which has circuit printed regions Sa and conductive interconnect printed regions Sb. Each circuit printed region Sa is rectangular in shape. Each interconnect printed region Sb extends along one side of each circuit printed region Sa. The boundary R between these two kinds of regions Sa and Sb has an inseparable connection portion R1 and a separable portion R2.

In FIGS. 1A–1B, 2A–2C, plural scroll coils A1–H8 are printed on both sides of the circuit printed region Sa. Of these scroll coils A1–H8, scroll coils Ai, Bi, Ei, Fi (i=1 to 8) and scroll coils Ci, Di, Gi, Hi (i=1 to 8) are printed at two different levels.

External connector terminals T for connection with an external circuit are printed at one longitudinal side of the elongated region Sb which is at one end of the separable portion R2. The external connector terminals T include plural dummy terminals, terminals A0, A9–H0, H9 for independent connections, and terminals A0', B9', C0', D9', E0', F9', G0', and H9'. These dummy terminals are connected with none of the scroll coils A1–H8.

Printed in the conductive interconnect printed region Sb are conductive interconnects for connecting the terminals A0, A9–H0, H9 of the external connector terminals T with the scroll coils A1–H8, respectively.

The terminal A0 for an independent connection is printed on the inner surface (FIGS. 1A and 2A) of the insulating sheet S and is connected with the scroll coil A1, which in turn is connected with the scroll coil A2 printed on the outer surface (FIG. 1B) of the insulating sheet S. The scroll coil A2 is connected with the scroll coil A3 on the outer surface (FIG. 1B) This scroll coil A3 is connected with the scroll coil A4 on the inner surface (FIG. 1A) . Similarly, the scroll coil A4 is connected with the scroll coils A5–A8 in turn. The scroll coil A8 is connected with the terminal A9 for an independent connection.

Other terminals B0, B9–D0, and D9 for independent connections are printed on the inner surface (FIG. 1A) of the insulating sheet S and similarly connected with the scroll coils B1–B8 through D1–D8.

Also, the terminals E0, E9–H0, and H9 which are used for independent connections are printed on the outer surface (FIG. 1B) of the insulating sheet S and connected with the scroll coils E1–E8 through H1–H8, respectively.

In FIGS. 2A and 2B, the terminals A9 and B0 for independent connections are interconnected by the terminal interconnects (A9–B0) for the independent connections. That is, the scroll coils A1–A8 are connected in series with the scroll coils B1–B8. The terminal A0 for an independent connection is connected with the terminal A0' for a series connection by the terminal interconnects (A0–A0') for independent/series connections. The terminal B9 for an independent connection is connected with the terminal B9' for a series connection by the terminal interconnects B9–B9' for independent/series connections.

Therefore, under the state of FIGS. 1A–1B and 2A–2C, electric power can be supplied between the connector terminals A0' and B9' for series connections while the scroll coils A1–A8, B1–B8 are connected in series. Similarly, electric power can be fed between the terminals C0' and D9', between E0' and F9', and between G0' and H9' while the scroll coils C1–D8, E1–F8, and G1–H8 are connected in series.

If each conductive interconnect printed region Sb is cut along a cutting line P1 shown in FIGS. 1A, 1B, 2A, and 2B, the conductive interconnects for independent/series connection terminals A0–A0', B9–B9', C0–C0', D9–D9', E0–E0', F9–F9', G0–G0', and H9–H9' are cut, as well as the conductive interconnects for independent connection terminals A9–B0, C9–D0, E9–F0, and G9–H0. Thus, electric power can be fed to the terminals A0, A9–H0, H9 independently. In this case, electric power can be fed to the scroll coils A1–A8 through H1–H8 independently.

When the upper two rows of terminals as viewed in FIGS. 2A and 2B are so bent along a bending line P2 in FIG. 2A as to overlap the lower two rows of terminals, the terminals A0–H9, A0'–H9' are located as shown in FIG. 2C. As can be seen from FIG. 2C, the terminals A0–H9 and A0'–H9' printed on the two opposite sides, respectively, of the conductive interconnect printed regions Sb are aligned to each other.

Under this condition, the needlelike protruding conductive terminals 2 of the connectors 1 shown in FIG. 3 pierce through these terminals A0–H9, A0'–H9'. An external power circuit (not shown) is connected with the terminals 2, and then this circuit is used.

The terminals A0–H9 and A0'–H9' printed on both sides of the conductive interconnect regions Sb are aligned to each other by bending along the bending line P2 the terminals (including the dummy terminals) arranged symmetrically about this bending line P2. Consequently, connections with an external circuit (not shown) are made easily.

In FIGS. 1A and 1B, if the separable region R2 of the boundary R between the circuit printed region Sa and the conductive interconnect printed region Sb on the printed circuit K is severed, semicircular indicia 3 are formed at regular intervals Ln (n=0, 1, 2, . . . ) along the upper and lower sides of the circuit printed region Sa. Ln corresponds to the circumferential length subtending an angle of 90° when the printed circuit K is wound into a cylinder.

In FIGS. 1A and 1B, those portions which are indicated by L0–L3 are the innermost portions of the cylinder shown in FIG. 4. Those portions which are indicated by L4–L7 are second innermost portions.

The spacing Ln between the successive indicia 3 is set as shown in FIG. 5 and is determined by the following equation. Let D be the inside diameter of the cylinder described above. Let t be the thickness of the printed circuit sheet K $$Ln = \frac{\pi\left(D + 2t \cdot \left[\frac{n}{4}\right]\right)}{4}$$

$n = 0 \sim$ $\left[\frac{n}{4}\right]$ : Gauss' notation $\frac{n}{4}$ = the largest integer which is less than $\frac{n}{4}$ -continued $$L0 = \frac{\pi\left(D + 2t \cdot \left[\frac{0}{4}\right]\right)}{4} = \frac{\pi(D + 2t \cdot 0)}{4}$$
$$= \frac{\pi D}{4}$$

$$L4 = \frac{\pi\left(D + 2t \cdot \left[\frac{4}{4}\right]\right)}{4} = \frac{\pi(D + 2t \cdot 1)}{4}$$
$$= \frac{\pi(D + 2t)}{4}$$

The lengths of the portions L0–L3 and of the portions L4–L7 are respectively given by

L0–L3=πD/4

L4–L7=(πD+2t)/4

Generally, the spacing Ln is expressed using the Gauss' notation.

As mentioned previously, the spacing Ln corresponds to the circumferential length of the cylinder subtending an angle of 90°, the cylinder being formed by winding the printed circuit K. As can be seen from FIGS. 1A and 1B, one scroll coil A1 corresponds to the portions L0 and L1. Therefore, this single scroll coil A1 covers a circumferential length subtending an angle of 180°. One complete circumference of the cylinder is formed by a pair of scroll coils (e.g., A1 and A4; C1 and C4).

In FIG. 1A, the scroll coils A1 and A4, for example, correspond to the portions L0–L3. The scroll coils A5–A8 correspond to the portions L4–L7. Therefore, the scroll coils A1 and A4 are printed over a circumferential length of πD/2. On the other hand, the scroll coils A5–A8 are printed over a circumferential length of (πD/2)+t.

Accordingly, when the printed circuit sheet K is coiled into a cylinder, every two scroll coils shown in FIG. 1A are printed over a circumferential length which increases by a length of t with going to the left. That is, each printed region where each of the scroll coils A1–H8 is printed increases in circumferential length by t for every two scroll coils with going from right to left in FIG. 1A.

In the present embodiment, the number of turns N of each of the scroll coils is printed as follows. The number of turns of coils A1–A8 is 18. The number of turns of coils B1–B8 is 19. The number of turns of coils C1–C8 is 18. The number of turns of coils D1–D8 is 19. The number of turns of coils E1–E8 is 19. The number of turns of coils F1–F8 is 20. The number of turns of coils G1–G8 is 19. The number of turns of coils H1–H8 is 20.

As described above, every two scroll coils shown in FIG. 1A are printed over a circumferential length which increases by t with going from right to left. As can be seen from FIGS. 1A and 1B, the circumferential length of the printed conductors of the scroll coils A1–H8 increases for every two coils with going from right to left. Thus, the scroll coils A1–H8 are widened with going to the right.

In the scroll coils A1–H8 of the present embodiment, the printed conductors of the scroll coils A1–H8 have a uniform circumferential width when the printed circuit K has been wound into a cylinder. However, the axial widths of the printed conductors increase as the circumferential lengths of the printed regions of the scroll coils A1–H8 increase.

For this reason, the printed conductors of the scroll coils located at the right in FIGS. 1A and 1B is larger in total length than those of the left coils but have a greater axial width. Consequently, the scroll coils A1–H8 have uniform resistance.

As can be seen from FIGS. 1A and 1B, a space Sc is formed between a set of scroll coils A1–D8 and another set of scroll coils E1–H8 to adjust the direction of the magnetic field. The field direction-adjusting space Sc shifts the right set of scroll coils A1–D8 along the surface of the cylinder with respect to the left set of scroll coils E1–H8 by 90°. Therefore, when the printed circuit K is wound into a cylinder, the adjusting gap Sc can shift the direction of the magnetic field developed by the right set of scroll coils E1–H8 with respect to the direction of magnetic field produced by the left set of scroll coils A1–D8 by 90°.

When the printed circuit K constructed as described above is wound into a cylinder, the indicia 3 are made to overlap each other. Thus, the printed circuit K can be easily wound such that the scroll coils are placed in position without shifting the inwardly placed scroll coils or the outwardly placed scroll coils in circumferential position.

Since the printed circuit can be coiled into a cylinder such that the scroll coils A1–H8 are placed in position circumferentially, the senses and positions of the produced magnetic fields can be established with high accuracy.

In FIGS. 1A and 1B, the scroll coils Ai, Bi, Ci, and Di (i=1 to 8) are printed to the right of the magnetic direction-adjusting space Sc, while the scroll coils Ei, Fi, Gi, and Hi are printed to the left. When the printed circuit is wound into a cylinder, these two sets of scroll coils can produce magnetic fields in directions which are accurately shifted with respect to each other by 90°. Hence, after the printed circuit has been coiled into a cylinder, these scroll coils can be used as accurate X and Y deflection coils, respectively.

Also in FIGS. 1A and 1B, the scroll coils Ai, Bi, Ei, Fi (i=1 to 8) and Ci, Di, Gi, Hi (i=1 to 8) are printed at two different levels, in two rows at each level. These coils can be used as X and Y deflection coils which are accurately positioned in place circumferentially at two different levels (i.e., shifted with respect to each other axially).

It is to be noted that 3, 4, or more levels of deflection coils can be readily fabricated by arranging the scroll coils in 3, 4, or more rows.

With respect to the printed regions of the scroll coils A1–H8, those printed regions of more outwardly placed scroll coils have larger circumferential lengths and their printed conductors have larger circumferential lengths. Since scroll coils located more outwardly on the wound printed circuit K are designed to have a greater axial width of printed conductors, the scroll coils A1–H8 show uniform resistance, whether they are positioned inside or outside. Specifically, only the axial widths of the printed conductors are increased by making use of the fact that the printed regions of more outwardly placed ones of the scroll coils A1–H8 have larger circumferential widths. Owing to this structure, the resistances of the scroll coils A1–H8 are decreased. In consequence, wasteful power consumption such as generation of heat from the printed conductors can be suppressed.

Under the condition shown in FIGS. 1A, 1B, 2A, and 2B, if electric power is fed between the connector terminals for series connection A0' and B9', between C0' and D9', between E0' and F9', and G0' and H9', the external connector terminals T of the construction described above permit the supply of the electric power while the scroll coils A1–B8, C1–D8, E1–F8, or G1–H8 are connected in series.

If each conductive interconnect printed region Sb is cut along the cutting line P1 shown in FIGS. 1A–2B, the conductive interconnects A0–A0', B9–B9', ..., H9–H9' for the terminals for independent and series connections and the conductive interconnects A9–B0, ..., G9–H0 for the terminals for independent connections are cut. This makes it possible to feed electric power to the terminals A0, A9–H0, and H9 independently, the terminals being used for independent connections. In this case, electric power can be fed to the scroll coils A1–A8 through H1–H8 independently. Also, they may be excited in parallel through external leads.

When the two rows of terminals on the upper side of FIG. 2A are bent along the bending line P2 shown in FIG. 2A so as to overlap the two lower rows of terminals, the terminals A0–H9 and A0'–H9' printed on both sides of the printed region Sb are aligned to each other, as can be seen from FIG. 2C. Under this condition, if the needlelike protruding conductive terminals 2 of the connectors 1 shown in FIG. 3 are pierced through these terminals A0–H9, A0'–H9', then an external power circuit (not shown) can be easily connected with the terminals 2 either by using a socket coupled to the terminals 2 or by directly soldering conductor leads to the terminals 2.

Figures 6A, 6B, 7:
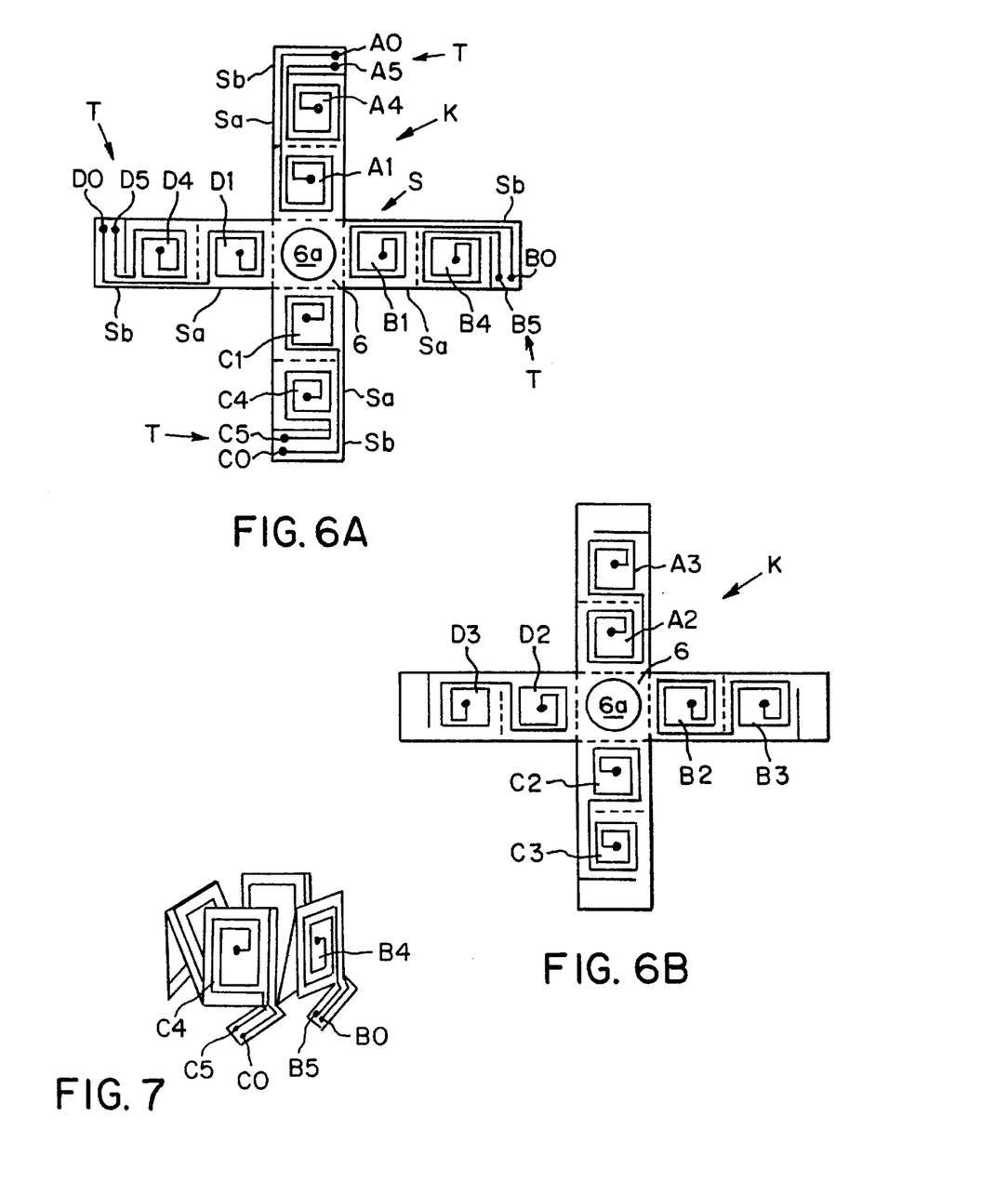
FIG. 6A is a top view of another printed circuit according to the invention, the printed circuit being adapted to form deflection coils.
FIG. 6B is a bottom view of the printed circuit shown in FIG. 6A.
FIG. 7 is a perspective view of the printed circuit shown in FIGS. 6A and 6B, and in which the printed circuit has been folded.

FIGS. 6A and 6B illustrate another printed circuit according to the invention, the printed circuit being adapted to form deflection coils. FIG. 6A is a top view of this printed circuit. FIG. 6B is a bottom view of this printed circuit. FIG. 7 shows a state in which this printed circuit has been folded.

When the printed circuit K for forming the deflection coils is expanded as shown in FIGS. 6A and 6B, its insulating sheet S assumes a crisscross form. This insulating sheet S is centrally provided with a rectangular hole formation region 6. A hole 6a extending through the cylinder is formed around the center of this hole formation region 6.

Four circuit printed regions Sa extend outwardly from the four sides, respectively, of the rectangular hole formation region 6. A conductive interconnect printed region Sb connects with the outer end of each circuit printed region Sa which can be folded along a fold line indicated by the dotted line. Under the folded condition, rectangular portions of the same shape are laid to overlap each other. One scroll coil (described later) is printed on each overlapping rectangular portion.

The scroll coils A1–A4, B1–B4, C1–C4, and D1–D4 are printed in the rectangular portions of the four circuit printed regions Sa.

The external connector terminals T are formed on the conductive interconnect printed regions Sb connecting with the four circuit printed regions Sa, respectively. The external connector terminal T in the conductive interconnect printed region Sb connecting with the circuit printed regions Sa where the scroll coils A1–A4 are formed have terminals A0 and A5.

The external connector terminals T on the conductive interconnect printed regions Sb connecting with the circuit printed regions Sa where the scroll coils B1–B4, C1–C4, and D1–D4 are printed have terminals (B0, B5), (C0, C5), and (D0, D5), respectively.

The terminal A0 of the external connector terminals T is connected with the scroll coil A1, which in turn is connected with the scroll coils A2, A3, and A4 in turn. The scroll coil A4 is connected with the terminal A5. Therefore, the scroll coils A1–A4 can be excited by feeding electric power between the terminals A0 and A5 of the external connector terminals T.

Similarly, the scroll coils B1–B4, C1–C4, and D1–D4 can be excited by feeding electric power between the terminals B0 and B5, between C0 and C5, and between D0 and D5.

When the printed circuit K of the above embodiment as described above is folded as shown in FIG. 7, the scroll coils A1–A4, B1–B4, C1–C4, and D1–D4 can be placed vertical to the four sides of the rectangular hole formation region 6 provided with the hole 6a. A cylindrical member (not shown) is passed into the hole 6a. The circuit printed regions Sa where the scroll coils A1–D4 etc. of the printed circuit K are formed are wound on the outer surface of this cylindrical member. Under this condition, the printed circuit K is fastened with tape, band, or the like. In this state, charged-particles passing through the cylindrical member (not shown) on which the scroll coils A1–A4 are wound are controllably deflected.

In this second embodiment, the strength of the developed magnetic field can be increased by increasing the number of the rectangular portions of the circuit printed regions Sa which are folded and laid to overlap each other.

Figure 8A:
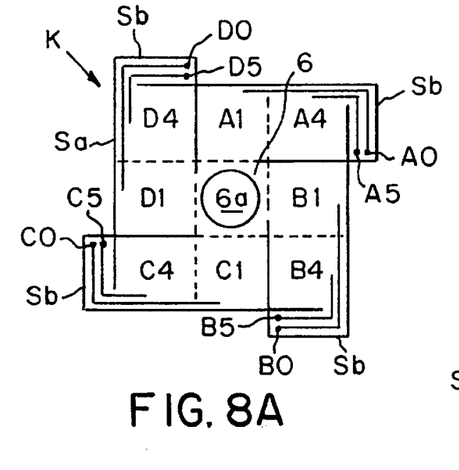
FIG. 8A is a top view of a further printed circuit according to the invention, the printed circuit being adapted to form deflection coils.
Figure 8B:
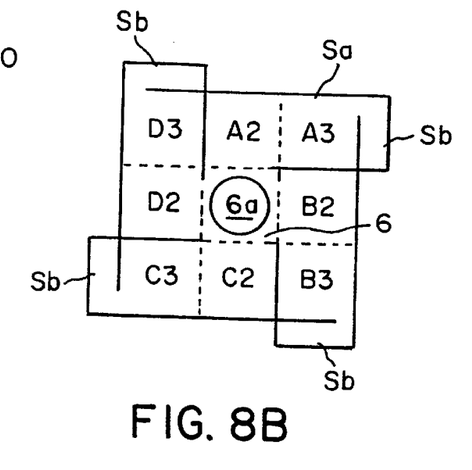
FIG. 8B is a bottom view of the printed circuit shown in FIG. 8A.

FIGS. 8A and 8B illustrate a further printed circuit K according to the invention, the printed circuit K being adapted to form deflection coils. FIG. 8A is a top view of this printed circuit. FIG. 8B is a bottom view of this printed circuit.

In FIGS. 8A and 8B, the bold lines indicate cutting lines. The dotted lines denote fold lines. In this embodiment, the printed circuit K has an insulating sheet S which takes a substantially square form when expanded. The insulating sheet S has a rectangular hole formation region 6 around its center, and a hole 6a extending through the cylinder is formed around the center of the hole formation region 6, in the same way as in the second embodiment above.

Circuit printed regions Sa are connected with the four sides of the rectangular hole formation region 6. When each circuit printed region Sa is cut along the cutting line indicated by the bold line, the scroll coils A1–A4, B1–B4, C1–C4, and D1–D4 can be separated into printed regions.

The conductive interconnect printed regions Sb are connected with the outer ends of the four regions where the scroll coils A1–A4, B1–B4, C1–C4, and D1–D4 are printed, respectively. External connector terminals T are formed on the four conductive interconnect printed regions Sb, respectively. These scroll coils A1–A4, B1–B4, C1–C4, and D1–D4 are so designed that they are excited by feeding electric power to the terminals (A0, A5), (B0, B5), (C0, C5), and (D0, D5) of the external connector terminals T formed in the conductive interconnect printed region Sb, in the same way as in the second embodiment described above.

After cutting the circuit along the cutting line indicated by the bold line, the circuit is folded along the fold lines indicated by the dotted lines in FIGS. 8A–8B. As a result, the rectangular portions of the same shape where one scroll coil is printed can be laid to overlap each other, in the same way as in the second embodiment. In this case, the scroll coils A1–A4, B1–B4, C1–C4, and D1–D4 can be placed vertical to the four sides of the rectangular hole formation region 6 provided with the hole 6a, in the same way as in the second embodiment. Therefore, this third embodiment yields the same advantages as the second embodiment.

Figure 9A:
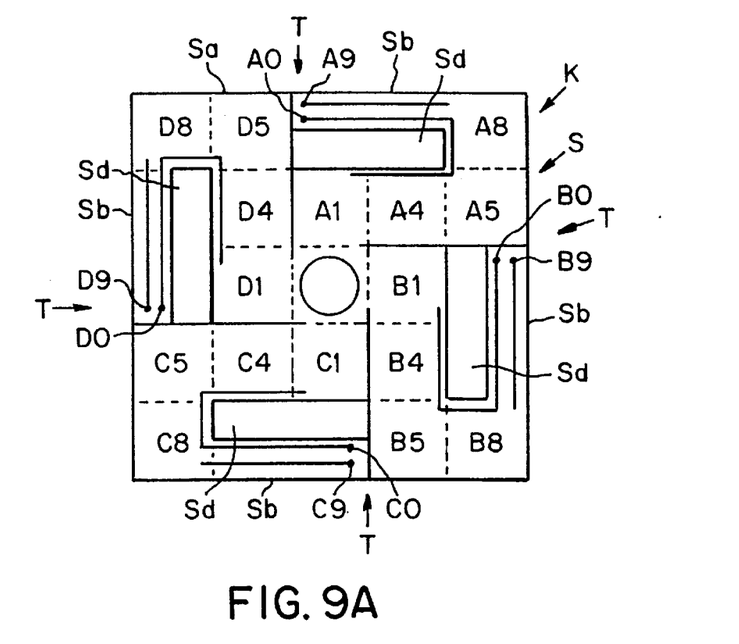
FIG. 9A is a top view of a still other printed circuit according to the invention, the printed circuit being adapted to form deflection coils.
Figure 9B:
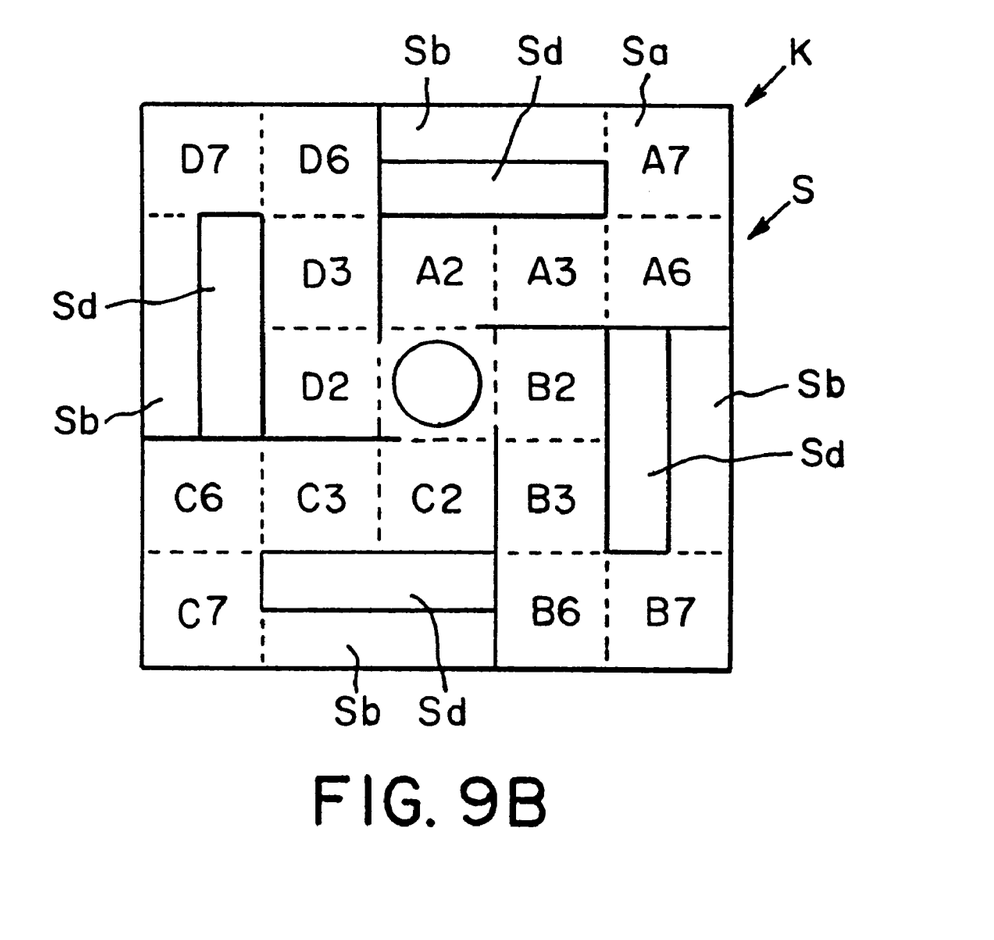
FIG. 9B is a bottom view of the printed circuit shown in FIG. 9A.

FIGS. 9A and 9B illustrate a still other printed circuit according to the invention, the printed circuit constituting a fourth embodiment of the invention. FIG. 9A is a top view of this printed circuit for forming deflection coils. FIG. 9B is a bottom view of the printed circuit.

In FIGS. 9A and 9B, bold lines indicate cutting lines, while dotted lines denote fold lines. This printed circuit K has an insulating sheet S which takes a substantially square form when expanded. The insulating sheet S has a rectangular hole formation region 6 around its center, and a hole 6a extending through the cylinder is formed around the center of the hole formation region 6, in the same manner as in the third embodiment.

Circuit printed regions Sa are connected with the four sides of the rectangular hole formation region 6. When cut along the cutting lines indicated by the bold lines, the printed regions Sa can be separated into regions where the scroll coils A1–A8, B1–B8, C1–C8, and D1–DB are printed, respectively. At this time, regions indicated by Sd in FIG. 9 are separated and removed.

Conductive interconnect printed regions Sb are connected with the outer ends of the four regions where the scroll coils A1–A8, B1–B8, C1–C8, and D1–D8 are printed, respectively. External connector terminals T are formed on the four conductive interconnect printed regions Sb, respectively. These scroll coils A1–A8, B1–B8, C1–C8, and D1–D8 are designed so that they are energized by feeding electric power between the terminals A0 and A9, between B0 and B9, between C0 and C9, and between D0 and D9 of the external connector terminals T formed on the conductive interconnect printed regions Sb, respectively, in the same way as in the third embodiment.

After cutting the circuit along the cutting line indicated by the bold line, the circuit is folded along the fold lines indicated by the dotted lines in FIGS. 9A–9B. As a result, the rectangular portions of the same shape where one scroll coil is printed can be laid to overlap each other, in the same way as in the third embodiment. In this case, the scroll coils A1–A8, B1–B8, C1–C8, and D1–D8 can be placed vertical to the four sides of the rectangular hole formation region 6 provided with the hole 6a, in the same way as in the third embodiment. Therefore, this fourth embodiment yields the same advantages as the third embodiment.

While the preferred embodiments of the present invention have been described in detail, it is to be understood that the invention is not limited thereto but rather various changes and modifications are possible within the scope of the invention delineated by the appended claims. In the above embodiments, the printed circuit K for forming deflection coils have the conductive interconnect printed regions Sb where the conductive interconnects and external connector terminals T are printed. This printed circuit K may be used in conjunction with another printed circuit on which circuits other than the scroll coils A1–H8 are printed.

What is claimed is:

1. A printed circuit for forming electromagnetic deflection coils, comprising:

a sheet having circuit printed regions and conductive interconnect printed regions;

a plurality of scroll coil circuits printed in said circuit printed regions;

external connector terminals printed in said conductive interconnect printed regions and acting to connect said scroll coil circuits with an external circuit;

conductive interconnects printed in said conductive interconnect printed regions and acting to connect said scroll coil circuits with said external connector terminals;

said external connector terminals including independent connection terminals for selectably connecting said scroll coil circuits with said external circuit independently, said external connector terminals further including series connection terminals for connecting some of said scroll coil circuits in series with each other and with said external circuit;

independent connection terminal interconnects for connecting selectably the independent connection terminals of some of said scroll coil circuits with each other to connect these scroll coil circuits in series; and independent/series connection terminal interconnects for connecting said independent connection terminals with said series connection terminals, both ends of said scroll coil circuits connected in series being connected with said independent connection terminals.

2. The printed circuit of claim 1, wherein (A) said sheet has said circuit printed regions and said conductive interconnect printed regions on both faces thereof;

(B) said scroll coil circuits are printed in said conductive interconnect printed regions formed on both faces of said sheet;

(C) said conductive interconnects and said external connector terminals are printed in said conductive interconnect printed regions formed on both faces of said sheet;

(D) each of said external connector terminals has plural terminals arranged symmetrically about a bending line established in each of said conductive interconnect printed regions; and (E) said external connector terminals have dummy connector terminals corresponding to the external connector terminals used on one face of said sheet, said dummy connector terminals being formed on the other face.

3. A printed circuit for forming deflection coils, comprising:

a sheet lap-wound into a cylinder forming a plurality of layers;

a plurality of scroll coils printed on said sheet in such a way that, when said sheet is wound into the cylinder, said scroll coils are arranged circumferentially and each one of said scroll coils covers a half revolution, each of said scroll coils having a circumferential width which increases with going outward; and indicia marked near an edge of said sheet and arranged circumferentially of said cylinder to indicate positions at which said scroll coils are printed.

4. The printed circuit of claim 3, wherein each of said scroll coils comprises a square scroll conductor consisting of axial conductors and circumferential conductors, said axial conductors being printed axially of said cylinder, said circumferential conductors being printed circumferentially, and wherein the axial conductors of each of said scroll coils have a width which increases with going outward.

5. The printed circuit of claim 3 or 4, wherein gaps of a given width are formed between successive ones of said scroll coils printed circumferentially to adjust directions of produced magnetic fields, and wherein said given width is so set that the scroll coils located on opposite sides of any one of said gaps are shifted with respect to each other by 90°.

6. The printed circuit of any one of claims 3 or 4, wherein said scroll coils are printed on said sheet in plural rows circumferentially.

7. A printed circuit comprising:

a sheet having a square hole formation region and scroll formation regions connected with four sides, respectively, of said hole formation regions so as to be foldable;

a hole formed in a central region of said hole formation region;

rectangular portions of the same shape formed in said scroll formation regions, said scroll formation regions being folded in such a way that said rectangular portions of the same shape overlap each other; and scroll coils printed in said rectangular portions.

8. The printed sheet of claim 7, wherein said scroll coil formation regions extend outward from the four sides of said square hole formation regions, whereby said sheet takes a crisscross form as a whole.

* * * * *

UNITED STATES PATENT AND TRADEMARK OFFICE
CERTIFICATE OF CORRECTION

PATENT NO. : 5,994,703
DATED : November 30, 1999
INVENTOR(S) : Yoshihiro Arai

It is certified that error appears in the above-identified patent and that said Letters Patent is hereby corrected as shown below:

Column 2 Line 35 "AO" should read --A0-- (letter "O" should be number "0").

Column 10 Line 3 "D1-DB" should read --D1-D8--.

Signed and Sealed this

Twenty-fifth Day of July, 2000

Attest:

Attesting Officer

Q. TODD DICKINSON

Director of Patents and Trademarks